US012298801B2

(12) United States Patent
Knyazev et al.

(10) Patent No.: US 12,298,801 B2
(45) Date of Patent: May 13, 2025

(54) METHOD AND SYSTEM FOR DETERMINING A GUIDED RANDOM DATA SAMPLING

(71) Applicant: Shanghai Xizhi Technology Co., Ltd, Shanghai (CN)

(72) Inventors: Andrew Knyazev, Shanghai (CN); Huaiyu Meng, Shanghai (CN); Yichen Shen, Shanghai (CN)

(73) Assignee: SHANGHAI XIZHI TECHNOLOGY CO., LTD, Shanghai (CN)

( * ) Notice: Subject to any disclaimer, the term of this patent is extended or adjusted under 35 U.S.C. 154(b) by 162 days.

(21) Appl. No.: 18/169,249

(22) Filed: Feb. 15, 2023

(65) Prior Publication Data

US 2023/0259155 A1     Aug. 17, 2023

(30) Foreign Application Priority Data

Feb. 17, 2022  (CN) .......................... 202210148039.2

(51) Int. Cl.
  *G06E 3/00* (2006.01)
  *H03M 1/12* (2006.01)
(52) U.S. Cl.
  CPC ............. *G06E 3/008* (2013.01); *H03M 1/124* (2013.01)
(58) Field of Classification Search
  CPC ................................ H03M 1/124; G02F 7/00
  See application file for complete search history.

(56) References Cited

U.S. PATENT DOCUMENTS

| | | | | |
|---|---|---|---|---|
| H353 H | * | 10/1987 | Taylor | 359/107 |
| 4,770,483 A | * | 9/1988 | Ridgway | G02F 1/0356 |
| | | | | 341/137 |
| 6,175,320 B1 | * | 1/2001 | Heflinger | H03M 1/361 |
| | | | | 341/137 |
| 6,178,020 B1 | * | 1/2001 | Schultz | G06E 1/045 |
| | | | | 359/107 |
| 6,469,649 B1 | * | 10/2002 | Helkey | H03M 1/1245 |
| | | | | 341/143 |
| 6,529,150 B1 | * | 3/2003 | Shoop | H03M 3/468 |
| | | | | 341/137 |
| 6,661,361 B1 | * | 12/2003 | Lewis | G02F 7/00 |
| | | | | 341/137 |
| 6,781,533 B2 | * | 8/2004 | Yap | H03M 3/496 |
| | | | | 341/143 |

(Continued)

*Primary Examiner* — Lam T Mai
(74) *Attorney, Agent, or Firm* — HAUPTMAN HAM, LLP

(57) ABSTRACT

A method and a system for determining a guided random data sampling are disclosed. The method comprises: converting input data into an optical signal with a variable average intensity through a first conversion module; converting the optical signal into a guided optical signal according to guiding data by a photonic computing module, wherein the average intensity of the guided optical signal varies with the average intensity of the optical signal; and converting the guided optical signal into output data and outputting the output data by a second conversion module; wherein the noise generated by at least one of the first conversion module, the photonic computing module, and the second conversion module is added to the output data as a perturbation. By yielding the perturbation in the optical-analog domain, the output data can be quickly converged to an expected solution in the solving operation of the combinatorial optimization problem.

27 Claims, 8 Drawing Sheets

(56) References Cited

U.S. PATENT DOCUMENTS

| | | | | |
|---|---|---|---|---|
| 7,564,387 | B1* | 7/2009 | Vawter | G02F 7/00 |
| | | | | 341/137 |
| 7,570,184 | B2* | 8/2009 | Ikeda | H03M 1/122 |
| | | | | 385/5 |
| 7,626,618 | B2* | 12/2009 | Adachi | H04N 25/627 |
| | | | | 341/122 |
| 8,446,305 | B1* | 5/2013 | Zanoni | H03M 1/124 |
| | | | | 341/137 |
| 8,514,115 | B2* | 8/2013 | Bogoni | G02F 7/00 |
| | | | | 341/137 |
| 8,655,176 | B2* | 2/2014 | Jackel | H04J 14/0223 |
| | | | | 398/189 |
| 8,902,095 | B2* | 12/2014 | Kanter | G02F 7/00 |
| | | | | 341/137 |
| 9,201,287 | B1* | 12/2015 | Taylor | G02F 7/00 |
| 10,725,361 | B1* | 7/2020 | Mukhanov | H03M 1/12 |
| 10,727,862 | B1* | 7/2020 | Shamee | H04B 10/67 |
| 10,803,259 | B2* | 10/2020 | Kenney | G06J 1/02 |
| 11,101,896 | B2* | 8/2021 | Kowalevicz | H04B 10/66 |
| 11,133,872 | B2* | 9/2021 | Ehrlichman | H04B 10/556 |
| 11,451,303 | B2* | 9/2022 | Hand | H04B 10/506 |
| 12,045,080 | B1* | 7/2024 | Baehr-Jones | G06N 3/0675 |
| 2003/0164785 | A1* | 9/2003 | Canini | H04N 25/00 |
| | | | | 341/155 |
| 2008/0129564 | A1* | 6/2008 | Kitayama | G02F 3/00 |
| | | | | 341/137 |
| 2010/0201345 | A1* | 8/2010 | Gupta | H03M 1/1042 |
| | | | | 341/137 |
| 2011/0068967 | A1* | 3/2011 | Mashiyama | H04N 25/75 |
| | | | | 341/164 |
| 2011/0234435 | A1* | 9/2011 | Woodward | G02F 7/00 |
| | | | | 341/137 |
| 2012/0200439 | A1* | 8/2012 | Hartl | H01S 3/06716 |
| | | | | 356/477 |
| 2012/0212360 | A1* | 8/2012 | Kanter | H03M 1/1245 |
| | | | | 341/137 |
| 2013/0120180 | A1* | 5/2013 | Kawahito | H04N 25/75 |
| | | | | 341/172 |
| 2015/0123713 | A1* | 5/2015 | Kahmen | H03M 1/0836 |
| | | | | 327/107 |
| 2019/0019100 | A1* | 1/2019 | Roques-Carmes | G06N 3/084 |
| 2019/0318236 | A1* | 10/2019 | Zou | G06N 3/08 |
| 2019/0370652 | A1* | 12/2019 | Shen | G06N 3/08 |
| 2020/0110432 | A1* | 4/2020 | Scofield | G02B 6/122 |
| 2020/0272794 | A1* | 8/2020 | Kenney | G06F 17/16 |
| 2020/0304210 | A1* | 9/2020 | Shamee | G02F 7/00 |
| 2021/0201126 | A1* | 7/2021 | Meng | G02F 3/00 |
| 2022/0209872 | A1* | 6/2022 | Li | H04B 10/70 |
| 2023/0412274 | A1* | 12/2023 | Nazarathy | H04B 10/516 |

* cited by examiner

METHOD AND SYSTEM FOR DETERMINING A GUIDED RANDOM DATA SAMPLING

CROSS-REFERENCE TO RELATED APPLICATION(S)

This application claims the benefit of, and priority to, the Chinese Patent Application No. 202210148039.2, filed on Feb. 17, 2022, which is herein incorporated by reference in its entirety.

FIELD OF THE INVENTION

The invention relates to computer science technology for signal processing, optimization, data sciences, machine learning, and matrix computing, and particularly relates to a method and a system for determining a guided random data sampling.

BACKGROUND OF THE INVENTION

In signal processing, optimization, data sciences, machine learning and matrix computing, large-scale computing on massive data are often involved. In order to improve the quality and speed of data processing and reduce the error rate of data processing, samples are selected or determined randomly from the massive data, which is called random data sampling.

In prior arts, the random data sampling is typically performed on digital electronic devices. At present, digital electronic circuits based on graphics processing unit (GPU), field programmable gate array (FPGA), and the like have been developed for large-scale computing, but the computing power and speed of these digital electronic devices will become the bottleneck of these large-scale computing.

At present, photonic computing technology has been proposed, for example, photonic integrated circuit (PIC) chips use light as the carrier of information to achieve data transmission, computing and so on. Compared with digital electronic technology, the energy efficiency and speed of the photonic computing technology are expected to improve by several orders of magnitude. However, the inventors of the present invention have found that the photonic computing technology has not been used effectively in the random data sampling.

SUMMARY OF THE INVENTION

The invention provides a method and a system for determining a guided random data sampling based on a photonic computing system.

According to an aspect of the present invention, there is provided a method for determining a guided random data sampling, comprising the following steps: S1, converting input data into an optical signal through a first conversion module, wherein the average intensity of the optical signal is variable; S2, converting the optical signal into a guided optical signal according to guiding data by a photonic computing module, wherein the average intensity of the guided optical signal varies with the average intensity of the optical signal; and S3, converting the guided optical signal into output data and outputting the output data by a second conversion module; wherein the noise generated by at least one of the first conversion module, the photonic computing module, and the second conversion module is added to the output data as a perturbation.

The inventors of the present invention have found that iterations do not converge to a desired solution if optical waves as the optical signal are transformed only and without perturbation. To overcome this deficiency, the embodiments of the present invention add a perturbation to the output data according to the noise generated by at least one of the first conversion module, the photonic computing module, and the second conversion module, so that the perturbed output data converges to an expected solution in operations such as signal processing, optimization, data sciences, machine learning, and matrix computing. Moreover, the operation speed is very slow if the perturbation is performed in the digital electronic device, but the speed can be significantly improved by yielding the perturbation in the optical-analog domain in the embodiments of the invention.

In some embodiments of the present invention, the first conversion module comprises a digital-to-analog converter and a modulator. At step S1, converting input data into an optical signal includes: converting the input data into an analog input signal by the digital-to-analog converter; and modulating an optical wave according to the analog input signal by the modulator to obtain the optical signal, wherein the average intensity of the optical wave is variable such that the average intensity of the optical signal varies with the average intensity of the optical wave.

In some embodiments of the present invention, the optical wave is generated by a light source, the brightness of the light source is controlled by a brightness controller, and decreasing the brightness of the light source decreases the average intensity of the optical wave.

In some embodiments of the present invention, the guiding data comprises a matrix of weights. At step S2, the converting the optical signal into the guided optical signal according to guiding data comprises modulating the optical signal according to a guiding transformation determined by the weights of the matrix to obtain the guided optical signal in the photonic computing module.

In some embodiments of the present invention, the optical signal comprises a plurality of modulated optical waves. The guiding transformation determined by the weights of the matrix comprises multiplying the plurality of modulated optical waves by the matrix of weights in the photonic computing module.

In some embodiments of the present invention, the guiding data is provided to the photonic computing module by a guiding controller.

In some embodiments of the present invention, the second conversion module comprises a photoelectric converter and an analog-to-digital converter. At step S3, converting the guided optical signal into output data and outputting the output data comprises converting the guided optical signal into an analog output signal by the photoelectric converter, and converting the analog output signal into a digital output signal as the output data by the analog-to-digital converter.

In some embodiments of the present invention, the method further includes: S4, performing additional processing on the output data and outputting the additionally processed data by a digital electronic circuit. In some embodiments of the present invention, the digital electronic circuit comprises one or a combination of a field programmable gate array (FPGA), an application specific integrated circuit (ASIC), a graphics processing unit (GPU), and a computer processing unit (CPU).

In some embodiments of the present invention, the additional processing comprises one or a combination of: adding a digital perturbation to the output data; modifying the output data according to a function; and calculating quantities determined by the output data for storing in a digital memory unit together with the original, perturbed, or modified output data.

In some embodiments of the present invention, the method further comprises: performing steps S1 to S4 in a loop, wherein the input data for the current execution of the loop comprises the additionally processed data output from the previous execution of the loop and wherein the loop is executed a pre-determined number, such as larger or equal to one of cycles; and storing the output data of all cycles in a digital memory unit to form a sequence of data. For example, the sequence of data stored in the digital memory unit approximates at least one of solutions of a problem of one or a combination of signal processing, optimization, data sciences, machine learning, matrix computing, and the like.

In the above embodiments, the problem is determined using the matrix of weights and the photonic computing module guides the plurality of modulated optical waves by further modulating the plurality of modulated optical waves (i.e. the optical signal with variable average intensity) according to the guiding transformation determined by the weights of the matrix. The digital electronic circuit determines, using the matrix of weights, a quantitative measure of a quality of an approximation of the solution of the problem by the output data stored as the sequence in the digital memory unit, wherein the determined quantitative measure comprises one or a combination of a quadratic form for the matrix of weights, an energy of a model determined by the matrix of weights, and an objective function or a valuation function of an optimization problem determined by the matrix of weights. Furthermore, the increase of the perturbations is tuned for the weights of the matrix by varying the intensity (brightness) of the light source to optimize the quantitative measure of the quality of the approximation of the solution of the problem by the output data stored as the sequence in the digital memory unit.

In some embodiments of the present invention, the matrix of weights is used to determine a model of a combinatorial optimization problem; the initial input data comprises an initial approximate solution of the combinatorial optimization problem; and the sequence of data is a sequence of updated approximate solutions to the combinatorial optimization problem. That is, in one embodiment, the method for determining a guided random data sampling comprises: given an initial approximate solution of the combinatorial optimization problem determined by the matrix of weights, that is, taking the initial approximate solution of the combinatorial optimization problem determined by the matrix of weights as input data; performing a guided random sampling comprising a guiding transformation and a random sampling operation on the initial approximate solution to output a series of output data and store the data in a digital memory unit to form a sequence of data which is a sequence of updated approximate solutions of the combinatorial optimization problem (i.e., S1-S4). Wherein the guiding transformation comprises applying the matrix of the combinatorial optimization problem to a guiding input vector resulting in a transformed vector (i.e., S2) and the random sampling operation comprises randomly perturbing a sampling input vector resulting in a sampled vector (i.e., at steps S1-S3, the noise generated by at least one of the first conversion module, the photonic computing module, and the second conversion module is added to the output data to perturb the output data), wherein the guiding input vector comprises one or a combination of the initial approximate solution and the sampled vector and the sampling input vector comprises one or a combination of the initial approximate solution and the transformed vector.

In some embodiments of the present invention, the combinatorial optimization problem comprises one or more of an Ising problem, a Max-Cut problem, a graph 2-coloring problem, and a Min-Cut problem. An objective function and the matrix of the combinatorial optimization problem can be determined from matrixes and objective functions of one or a combination of the Ising problem, the Max-Cut problem, the graph 2-coloring problem, and the Min-Cut problem, wherein an approximate or exact solution of the combinatorial optimization problem comprises a vector approximately or exactly minimizing or maximizing the objective function, which corresponds to an approximate or exact solution to the one or the combination of the Ising problem, the Max-Cut problem, the graph 2-coloring problem, and the Min-Cut problem. In some embodiments of the present invention, the initial approximate solution comprises an input binary vector; the guiding input vector comprises the initial approximate solution binary vector and the sampling input vector comprises the transformed vector; the random sampling operation further comprises comparing the perturbed transformed vector to a threshold vector by a comparator (For example, at step S3, thresholding the guided optical signal to the digital output signal that is binary consisting of zeros and ones through a analog-to-digital converter combined with a thresholding unit) to yield the updated approximate solution of the combinatorial optimization problem comprising an output binary vector. The randomly sampled vectors are iterated in an iterative loop starting from an initial approximate solution to yield a sequence of approximate solutions to the combinatorial optimization problem.

According to another aspect of the present invention, there is provided a system for determining a guided random data sampling, comprising: a first conversion module for converting input data into an optical signal, wherein the average intensity of the optical signal is variable; a photonic computing module, in communication with the first conversion module, for converting the optical signal into a guided optical signal according to guiding data, wherein the average intensity of the guided optical signal varies with the average intensity of the optical signal; and a second conversion module, in communication with the photonic computing module, for converting the guided optical signal into output data and outputting the output data; wherein the noise generated by at least one of the first conversion module, the photonic computing module, and the second conversion module is added to the output data as a perturbation.

In some embodiments of the present invention, the first conversion module comprises: a digital-to-analog converter for converting the input data into an analog input signal; and a modulator, in communication with the digital-to-analog converter, for modulating an optical wave according to the analog input signal to obtain the optical signal, wherein the average intensity of the optical wave is variable such that the average intensity of the optical signal varies with the average intensity of the optical wave.

In some embodiments of the present invention, the system further comprises a light source for generating the optical wave and a brightness controller for controlling the brightness of the light source such that decreasing the brightness of the light source decreases the average intensity of the optical wave.

In some embodiments of the present invention, the system further comprises a guiding controller for providing the guiding data to the photonic computing module. In an embodiment, the guiding data comprises a matrix of weights. The photonic computing module is configured to further modulate the optical signal according to a guiding transformation determined by the weights of the matrix to guide the optical signal, such that the guided optical signal is obtained.

In some embodiments of the present invention, the optical signal comprises a plurality of modulated optical waves. The guiding transformation determined by the weights of the matrix comprises multiplying the plurality of modulated optical waves by the matrix of weights in the photonic computing module.

In some embodiments of the present invention, the second conversion module comprises: a photoelectric converter, in communication with the photonic computing module, for converting the guided optical signal into an analog output signal; and an analog-to-digital converter, in communication with the photoelectric converter, for converting the analog output signal into a digital output signal as the output data.

In some embodiments of the present invention, the system further includes a digital electronic circuit, in communication with the second conversion module, for performing additional processing on the output data and outputting the additionally processed data. In some embodiments of the present invention, the digital electronic circuit comprises one or a combination of FPGAs, ASICs, GPUs, and CPUs. In some embodiments of the present invention, the additional processing includes one or a combination of adding a digital perturbation to the output data, modifying the output data according to a function, and calculating quantities determined by the output data for storing in a digital memory unit together with the original, perturbed, or modified output data.

In some embodiments of the present invention, the system further includes a digital memory unit, in communication with the digital electronic circuit and the first conversion module, for storing the input data and the additionally processed data. The processing performed by the first conversion module, the photonic computing module, the second conversion module and the digital electronic circuit are executed in a loop, the digital memory unit is operated such that the input data for the current execution of the loop comprises the additionally processed data output from the previous execution of the loop, the loop is executed a pre-determined number of cycles, and the output data of all cycle is stored by the digital electronic circuit into the digital memory unit to form a sequence of data. The sequence of data stored in the digital memory unit approximates at least one of solutions of a problem of one or a combination of signal processing, optimization, data sciences, machine learning, matrix computing, and the like.

In some embodiments of the present invention, the matrix of weights is used to determine a model of a combinatorial optimization problem; the initial input data comprises an initial approximate solution of the combinatorial optimization problem; and the sequence of data is a sequence of updated approximate solutions to the combinatorial optimization problem. That is, given an initial approximate solution of the combinatorial optimization problem determined by the matrix, an updated approximate solution of the combinatorial optimization problem can be determined by the above-described guided random sampling including the guiding transformation and the random sampling operation. In some embodiments of the present invention, the combinatorial optimization problem comprises one or more of an Ising problem, a Max-Cut problem, a graph 2-coloring problem, and a Min-Cut problem.

According to embodiments of the present invention, an objective function and the matrix of the combinatorial optimization problem can be determined from matrixes and objective functions of one or a combination of the Ising problem, the Max-Cut problem, the graph 2-coloring problem, and the Min-Cut problem, wherein an approximate or exact solution of the combinatorial optimization problem comprises a vector approximately or exactly minimizing or maximizing the objective function, which corresponds to an approximate or exact solution to the one or the combination of the Ising problem, the Max-Cut problem, the graph 2-coloring problem, and the Min-Cut problem. In some embodiments of the present invention, the initial approximate solution comprises an input binary vector; the guiding input vector comprises the initial approximate solution binary vector and the sampling input vector comprises the transformed vector; the random sampling operation further comprises comparing the perturbed transformed vector to a threshold vector by a comparator (For example, thresholding the guided optical signal to the digital output signal that is binary consisting of zeros and ones through a analog-to-digital converter combined with a thresholding unit) to yield the updated approximate solution of the combinatorial optimization problem comprising an output binary vector. The randomly sampled vectors are iterated in an iterative loop starting from an initial approximate solution to yield a sequence of approximate solutions to the combinatorial optimization problem.

In some embodiments of present invention, the digital electronic circuit is configured to further perform a quantitative measure of the quality of the approximate solution to the combinatorial optimization problem by the output data stored as the sequence of data in the digital memory unit. Wherein the determined quantitative measure comprises one or a combination of a quadratic form for the matrix of weights, an energy of a model determined by the matrix of weights, and an objective function or a valuation function of an optimization problem determined by the matrix of weights.

It can be seen from the above description that the embodiments of the present invention propose a technique of determining a guided random data sampling based on a photonic computing module. According to the embodiments, a perturbation is introduced by a light source of variable brightness and each transformation during the sampling process which is guided by a matrix of weights determining a problem, so that an approximate solution to the problem can converge to a desired value. Moreover, compared with sampling on a digital electronic device, the embodiments of the invention can significantly improve the operation speed.

Aspects, features, advantages and the like of the embodiments will be described in greater detail with reference to the drawings. The aspects, features, advantages and the like will be apparent according to the detailed description with reference to the drawings.

BRIEF DESCRIPTION OF THE DRAWINGS

FIGS. 7a to 7e show the change of the signal waveform output from some node devices in the example shown in FIG. 6, in which FIG. 7a is a curve showing the change of the brightness of the light source, FIG. 7b is a signal waveform showing the change of the amplitude of the analog input signal output from the digital-to-analog converter, FIG. 7c is a curve showing the intensity change of the modulated optical wave output from the modulator, FIG. 7d is a curve showing the intensity change of the guided optical wave output from the photonic computing module, and FIG. 7e is a signal waveform showing the change of the amplitude of the analog output signal output from the photoelectric converter.

DETAILED DESCRIPTION OF THE INVENTION

Figure 1:
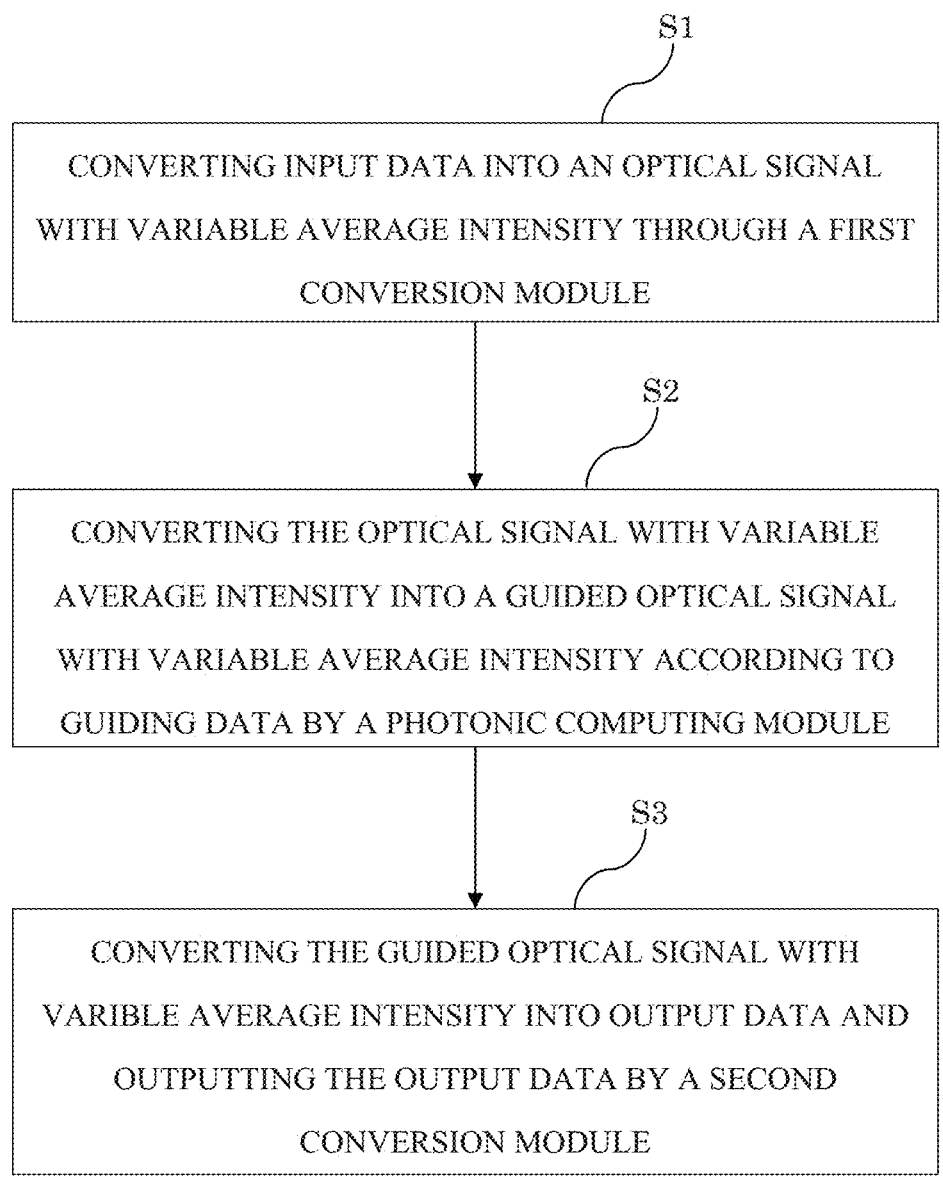
FIG. 1 is a flow chart illustrating a method for determining a guided random data sampling according to an embodiment of the present invention.

In order to facilitate understanding of various aspects, features and advantages of the technical solutions of the present invention, the present invention will be described in detail below with reference to the drawings. It should be understood that the following various embodiments are intended only for illustration, but not for limiting the protection scope of the present invention.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise", "comprises", and "comprising", "include", "includes" and "including", "has", "have" and "having" when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

The terms "approximately", "about", "basically", "substantially", and the like when used in this specification, specify that a person skilled in the art can solve the technical problem and basically achieve the technical effect within an acceptable error range.

Furthermore, the terms "connected" and "connecting" as used herein include any direct and indirect means of connection. Thus, if the specification describes that a first device is connected to a second device, it means that the first device can be directly connected to the second device, or indirectly connected to the second device through other devices. The term "communication" as used herein means that there is a transfer of information, data, messages, or signals between two objects, including sending, receiving, interacting, etc.

The terms "first", "second", and the like as used herein are used to distinguish different elements, which do not represent the order and do not limit the different elements to different types.

In addition, some of the flows described in the specification, claims, and drawings of the present application include a plurality of operations, processes, and steps that appear in a particular order, but these operations, processes, and steps may be performed out of order or in parallel as they appear herein. The reference numbers of operations, processes, and steps, such as S1, S2, etc., are only used to distinguish different operations, processes, and steps, and the reference numbers themselves do not represent any order. Additionally, the flows may include more or fewer operations, processes, and steps and the operations, processes, and steps may be performed sequentially or in parallel.

In large-scale operations such as signal processing, optimization, data sciences, machine learning, and matrix computation, it is usually necessary to extract sample data from a large number of original data to train the computational model of related problems, so as to make the output data of the computational model close to or approximate the real solution of the problem. In order to improve the operation speed and the calculation accuracy, the embodiments of the invention provide a technical solution for determining a guided random data sampling based on a photonic computing module, which relates to an optical domain for optical signal processing, an analog domain for analog electric signal processing and a digital domain for digital electric signal processing, and at least one of processing devices in the three domains has noise. Thus a perturbation can be introduced into at least one of the optical signal and the analog electrical signal through the device having noise to add perturbation to the output data, so that the output data can converge to the desired solution of the problem. And the operation speed can be significantly improved as compared to processing in a pure electric domain.

Referring to FIG. 1, a method for determining a guided random data sampling according to one embodiment of the present invention is shown. As shown in FIG. 1, the method comprises: S1, converting input data into an optical signal through a first conversion module, wherein the average intensity of the optical signal is variable; S2, converting the optical signal into a guided optical signal according to guiding data by a photonic computing module, wherein the average intensity of the guided optical signal varies with the average intensity of the optical signal; and S3, converting the guided optical signal into output data and outputting the output data by a second conversion module. Wherein the noise generated by at least one of the first conversion module, the photonic computing module, and the second conversion module is added to the output data as a perturbation.

The optical signal may be a modulated optical wave. If the modulated optical wave is transformed only in the absence of perturbations, iterations will not converge to the desired solution of a problem. Therefore, in the embodiment, at least one of the first conversion module, the photonic computing module, and the second conversion module generates the noise to add the perturbation to the output data so that the perturbed output data converges to a desired solution in operations such as signal processing, optimization, data sciences, machine learning, and matrix calculation. If the perturbation is performed only in the digital electronic device, the processing speed is very slow, but the embodiment of the invention can generate the perturbation in both the optical domain and the analog domain such that the processing speed can be significantly improved.

In some embodiments, the guiding data comprises a matrix of weights that is used to determine a problem model, e.g., a combinatorial optimization problem model including one or more of an Ising problem, a Max-Cut problem, a graph 2-coloring problem, and a Min-Cut problem. In the photonic computing module, a guiding transformation is performed by multiplying the optical signal with variable average intensity by the matrix, and the final output data is the approximate solution of the combinatorial optimization problem.

In some embodiments, the processing of S1 to S3 is performed in a loop by iterating the output data as the input data or the input data comprising the output data, the output data of each loop are a series of updating approximate solutions of the problem and converge toward the desired solution of the problem.

In some embodiments, the first conversion module includes a digital-to-analog converter and a modulator. In processing S1, converting input data to an optical signal includes: converting the input data to an analog input signal by the digital-to-analog converter; and modulating an optical wave according to the analog input signal by the modulator to obtain the optical signal, wherein the average intensity of the obtained optical signal varies with the average intensity of the optical wave. In some embodiments, a light source generates the optical wave, the brightness of the light source is controlled by a brightness controller, and decreasing the brightness of the light source decreases the average intensity of the optical wave. In some embodiments, the modulator includes a micro-ring modulator, an MZI modulator, an electro-absorption modulator, or the like.

In some embodiments, the optical signal comprises a plurality of modulated optical waves. In processing S2, converting the optical signal into a guided optical signal according to the guiding data comprises further modulating the optical signal according to a guiding transformation determined by the weights of the matrix to obtain the guided optical signal comprising a plurality of guided optical waves in the photonic computing module. In some embodiments, the guiding transformation determined by the weights of the matrix comprises multiplying the plurality of modulated optical waves by the matrix of weights in the photonic computing module to convert the plurality of modulated optical waves into the plurality of guided optical waves. In some embodiments, the guiding data is provided to the photonic computing module by a guiding controller. In some embodiments, the photonic computing module includes a Mach-Zehnder interferometer network.

In some embodiments, the second conversion module includes a photoelectric converter and an analog-to-digital converter. In processing S3, converting the guided optical signal into output data and outputting the output data comprises converting the guided optical signal into an analog output signal by the photoelectric converter, and converting the analog output signal into a digital output signal as the output data by the analog-to-digital converter. In some embodiments, the analog-to-digital converter is provided with a thresholding unit to threshold the analog output signal into a digital output signal that is a binary signal consisting of 0 and 1. Since at least one of the modulator, the photonic computing module, and the photoelectric converter in the optical domain has noise, and/or at least one of the digital-to-analog converter and the analog-to-digital converter in the analog domain has noise, the apparatus or device having noise introduces a perturbation into at least one of the optical signal and the analog signal. And decreasing the brightness of the light source decreases a ratio of the noise and at least one of the average intensities of the optical signal and the average amplitudes of the analog signal, thereby adding the perturbation to the digital output data, wherein the level of the perturbation increases with the decrease of the ratio, thereby causing the digital output data to converge toward the desired solution to the problem.

Figure 2:
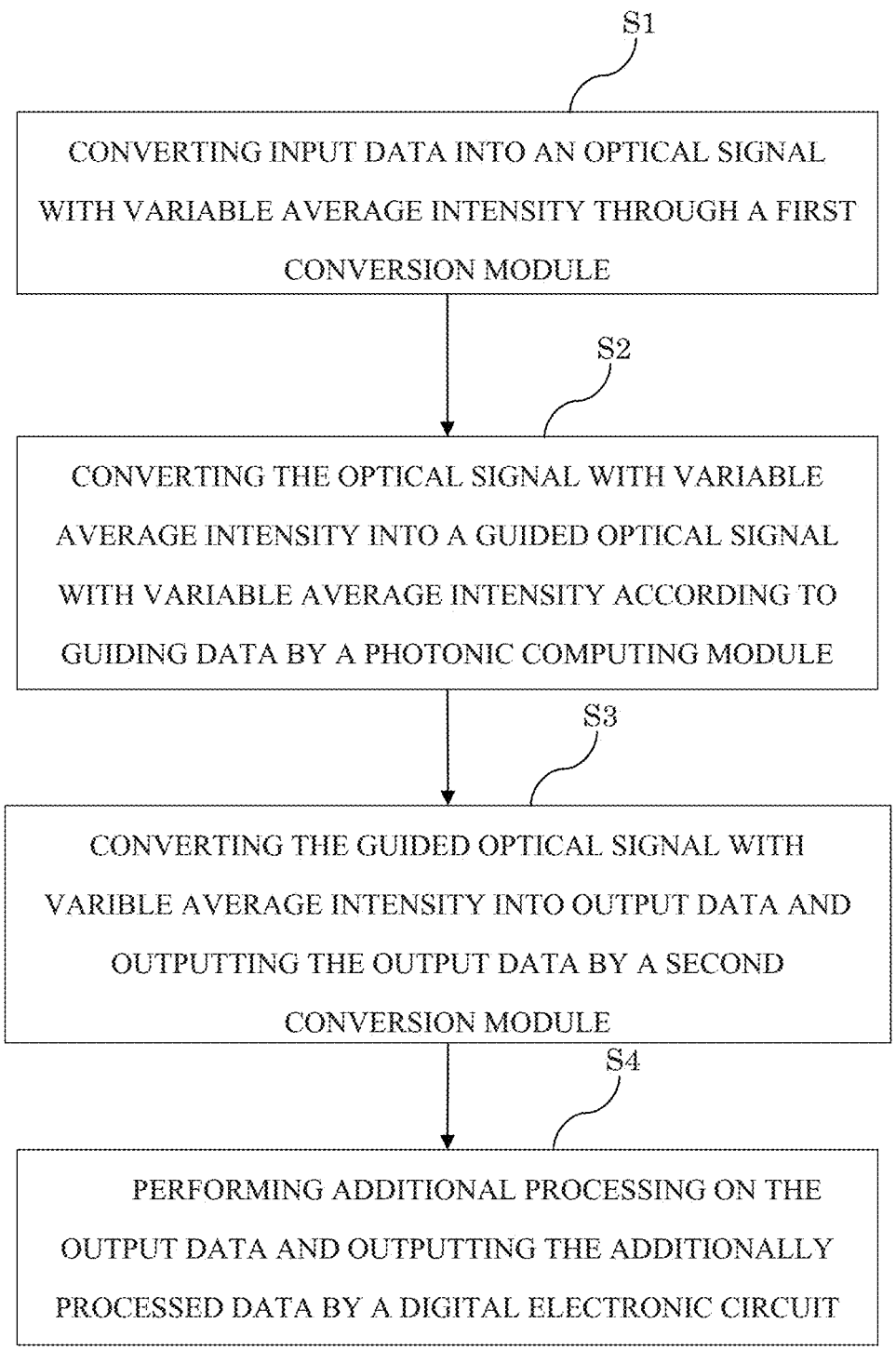
FIG. 2 is a flow chart illustrating a method for determining a guided random data sampling according to another embodiment of the present invention.

FIG. 2 illustrates a method for determining a guided random data sampling according to another embodiment of the present invention. The method according to the embodiment further comprises, in addition to the processing of the above embodiments, S4, performing additional processing on the output data and outputting the additionally processed data by a digital electronic circuit. In some embodiments, the digital electronic circuit includes one or a combination of FPGAs, ASICs, GPUs, and CPUs.

In some embodiments, the additional processing includes one or a combination of: adding a digital perturbation to the output data; modifying the output data according to a function; and calculating quantities determined by the output data for storing in a digital memory unit together with the original, perturbed, or modified output data.

In some embodiments, the processing of S1 to S4 is executed in a loop, wherein the input data for the current execution of the loop comprises the additionally processed data output from the previous execution of the loop and wherein the loop is executed a pre-determined number, such as larger or equal to 1 of cycles. The output data of each cycle is stored in a digital memory unit to form a data sequence. For example, the data sequence stored in the digital memory unit approximates at least one solution of a problem of one or a combination of signal processing, optimization, data sciences, machine learning, matrix computation, and the like. The digital memory unit includes any one or any suitable combination of a floppy disk, a hard disk, a random access memory (RAM), a read-only memory (ROM), an erasable programmable read-only memory (EPROM or Flash memory), a compact disc read-only memory (CD-ROM), and the like.

In some embodiments, the matrix of weights is used to determine the problem model and the photonic computing module guides the plurality of modulated optical waves by further modulating the plurality of modulated optical waves (i.e. optical signals with variable average intensity) according to the guiding transformation determined by the weights of the matrix. The digital electronic circuit determines, using the matrix of the weights, a quantitative measure of a quality of an approximation of the solution of the problem by the output data stored as the sequence in the digital memory unit, wherein the determined quantitative measure comprises one or a combination of a quadratic form for the matrix of the weights, an energy of a model determined by the matrix of the weights, and an objective function or a valuation function of an optimization problem determined by the matrix of the weights. Furthermore, the increase of the perturbations is tuned for the weights of the matrix by varying the intensity (brightness) of the light source to optimize the quantitative measure of the quality of the approximation of the solution of the problem by the output data stored as the sequence in the digital memory unit.

Embodiments of the present invention are described below from the perspective of information or data carried by signals.

In some embodiments, a model of a combinatorial optimization problem is determined using the matrix of weights.

The initial input data comprises an initial approximate solution of the combinatorial optimization problem, and the data sequence is a sequence of updated approximate solutions of the combinatorial optimization problem. That is, in one embodiment, the method comprises: given an initial approximate solution of the combinatorial optimization problem determined by the matrix of weights, that is, taking the initial approximate solution of the combinatorial optimization problem determined by the matrix of weights as input data; performing a guided random sampling comprising a guiding transformation and a random sampling operation on the initial approximate solution (i.e., S1-S4) in a loop, wherein the loop is executed a pre-determined number of cycles and the output data of multiple cycles are stored in the digital memory unit to form a sequence of data which is a sequence of updated approximate solutions of the combinatorial optimization problem. Wherein the guiding transformation comprises applying the matrix of the combinatorial optimization problem to a guiding input vector resulting in a transformed vector (i.e., S2) and the random sampling operation comprises randomly perturbing a sampling input vector resulting in a sampled vector (i.e., in processing S1-S3, the noise generated by at least one of the first conversion module, the photonic computing module, and the second conversion module is added to the output data to perturb the output data), wherein the guiding input vector comprises one or a combination of the initial approximate solution and the sampled vector, and the sampling input vector comprises one or a combination of the initial approximate solution and the transformed vector.

In some embodiments, the combinatorial optimization problem comprises one or more of an Ising problem, a Max-Cut problem, a graph 2-coloring problem, and a Min-Cut problem. Using the embodiments of the present invention, an objective function and the matrix of the combinatorial optimization problem can be determined from matrixes and objective functions of one or a combination of the Ising problem, the Max-Cut problem, the graph 2-coloring problem, and the Min-Cut problem, wherein an approximate or exact solution of the combinatorial optimization problem comprises a vector approximately or exactly minimizing or maximizing the objective function, which corresponds to an approximate or exact solution to the one or the combination of the Ising problem, the Max-Cut problem, the graph 2-coloring problem, and the Min-Cut problem. In some embodiments of the present invention, the initial approximate solution comprises an input binary vector; the guiding input vector comprises the initial approximate solution binary vector and the sampling input vector comprises the transformed vector; the random sampling operation further comprises comparing the perturbed transformed vector to a threshold vector by a comparator (For example, in processing S3, thresholding the guided optical signal to the digital output signal that is binary consisting of zeros and ones through a analog-to-digital converter combined with a thresholding unit) to yield the updated approximate solution of the combinatorial optimization problem comprising an output binary vector. The randomly sampled vectors are iterated in an iterative loop starting from an initial approximate solution to yield a sequence of approximate solutions to the combinatorial optimization problem.

The method for determining a guided random data sampling of the present invention has been described above from the perspective of signal processing and data processing (i.e., information processing) respectively. A system relating to the random data sampling is described in detail below with reference to the drawings and embodiments. The processing and functional effects performed by each component in the system are consistent with the corresponding parts in the above method, in other words, the processing described in the above method can be incorporated into the following system description.

Figure 3:
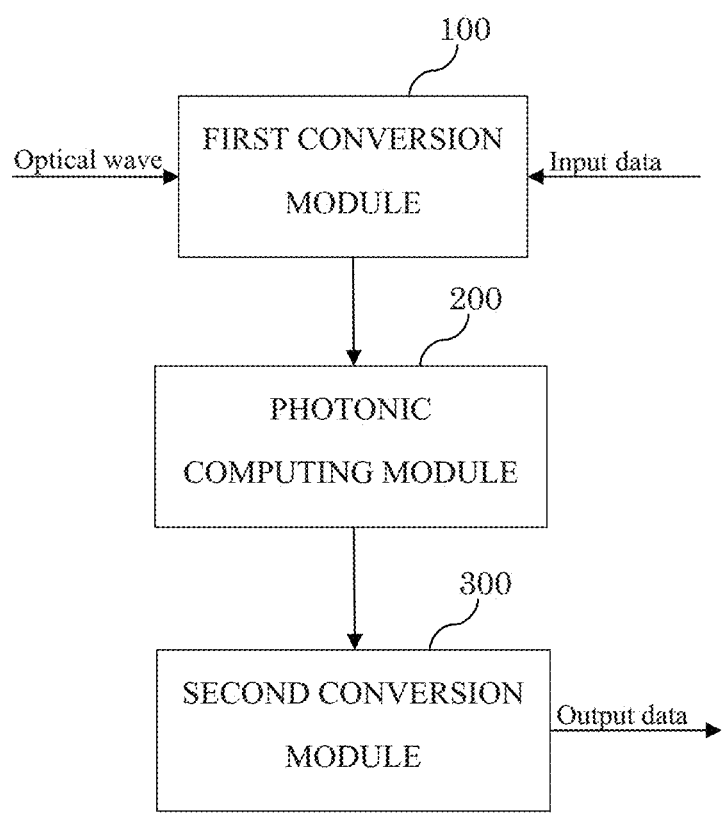
FIG. 3 is a block diagram illustrating a configuration of a system for determining a guided random data sampling according to an embodiment of the present invention.

FIG. 3 illustrates a system for determining a guided random data sampling according to an embodiment of the present invention. In the embodiment, as shown in FIG. 3, the system for determining a guided random data sampling at least includes a first conversion module 100, a photonic computing module 200, and a second conversion module 300. The first conversion module 100 is configured to convert input data into an optical signal, wherein the average intensity of the optical signal is variable. That is, the input data is carried into an optical wave and the average intensity of the optical wave is variable. The photonic computing module 200 is in communication with the first conversion module 100 and is configured to convert the optical signal into a guided optical signal according to guiding data, wherein an average intensity of the guided optical signal varies with the average intensity of the optical signal. The second conversion module 300 is in communication with the photonic computing module 200 and is configured to convert the guided optical signal into output data and output the output data. After the signal carrying the information or data is converted or processed, the noise generated by at least one of the first conversion module, the photonic computing module, and the second conversion module is added to the output data as a perturbation to the output data.

Figure 4:
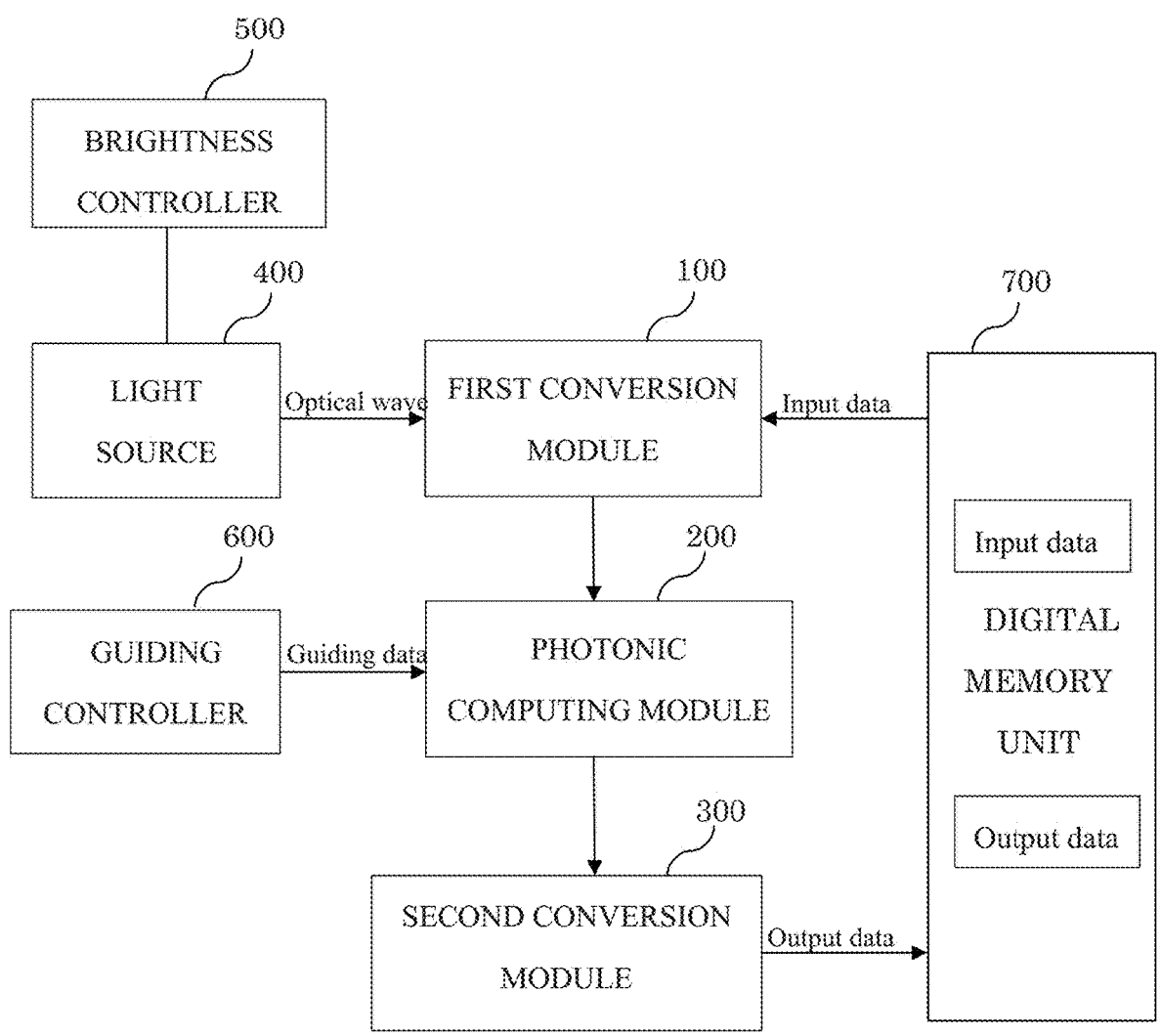
FIG. 4 is a block diagram illustrating a configuration of a system for determining a guided random data sampling according to another embodiment of the present invention.

FIG. 4 illustrates a system for determining a guided random data sampling according to another embodiment of the present invention. The embodiment shown in FIG. 4 and the embodiment shown in FIG. 3 have the same first conversion module 100, photonic computing module 200, and second conversion module 300, and the difference between them is that the system of the former further includes a light source 400, a brightness (light intensity) controller 500, a guiding controller 600, and a digital memory unit 700. Specifically, the light source 400 generates the optical wave, and the brightness controller 500 is configured to control the brightness of the light source 400 such that the average intensity of the optical wave can decrease as the brightness of the light source 400 decreases. The first conversion module 100 carries the input data into the optical wave to obtain the optical signal. For example, the first conversion module 100 may comprise a digital-to-analog converter for converting the input data into an analog input signal and a modulator for modulating the optical wave according to the analog input signal to obtain the optical signal. The optical signal is provided to the photonic computing module 200. The guiding controller 600 provides guiding data to the photonic computing module 200. In an embodiment, the guiding data comprises a matrix of weights. The photonic computing module 200 modulates the optical signal according to a guiding transformation determined by the weights of the matrix to guide the optical signal, such that the guided optical signal is obtained. In some embodiments, the optical signal comprises a plurality of modulated optical waves. The guiding transformation determined by the weights of the matrix comprises multiplying the plurality of modulated optical waves by the matrix by the photonic computing module 200. The second conversion module 300 converts the guided optical signal into the digital output data. For example, the second conversion module 300 may comprise a photoelectric converter for converting the guided optical signal into an analog output signal and an analog-to-digital converter for converting the analog output signal into a digital output signal as the output data. In this embodiment, the output data and the input data are stored by the digital memory unit 700, and the output data may be provided to the first conversion module 100 as the input data, thereby performing an iterative loop process to converge the output data to a desired solution of the problem determined by the matrix. In an alternative embodiment, the output data and the input data may be stored in different memory locations. In some embodiments, the digital memory unit comprises any one of a floppy disk, a hard disk, a random access memory (RAM), a read-only memory (ROM), an erasable programmable read-only memory (EPROM or Flash memory), a compact disc read-only memory (CD-ROM), an optical storage device, or any suitable combination of these.

Figure 5:
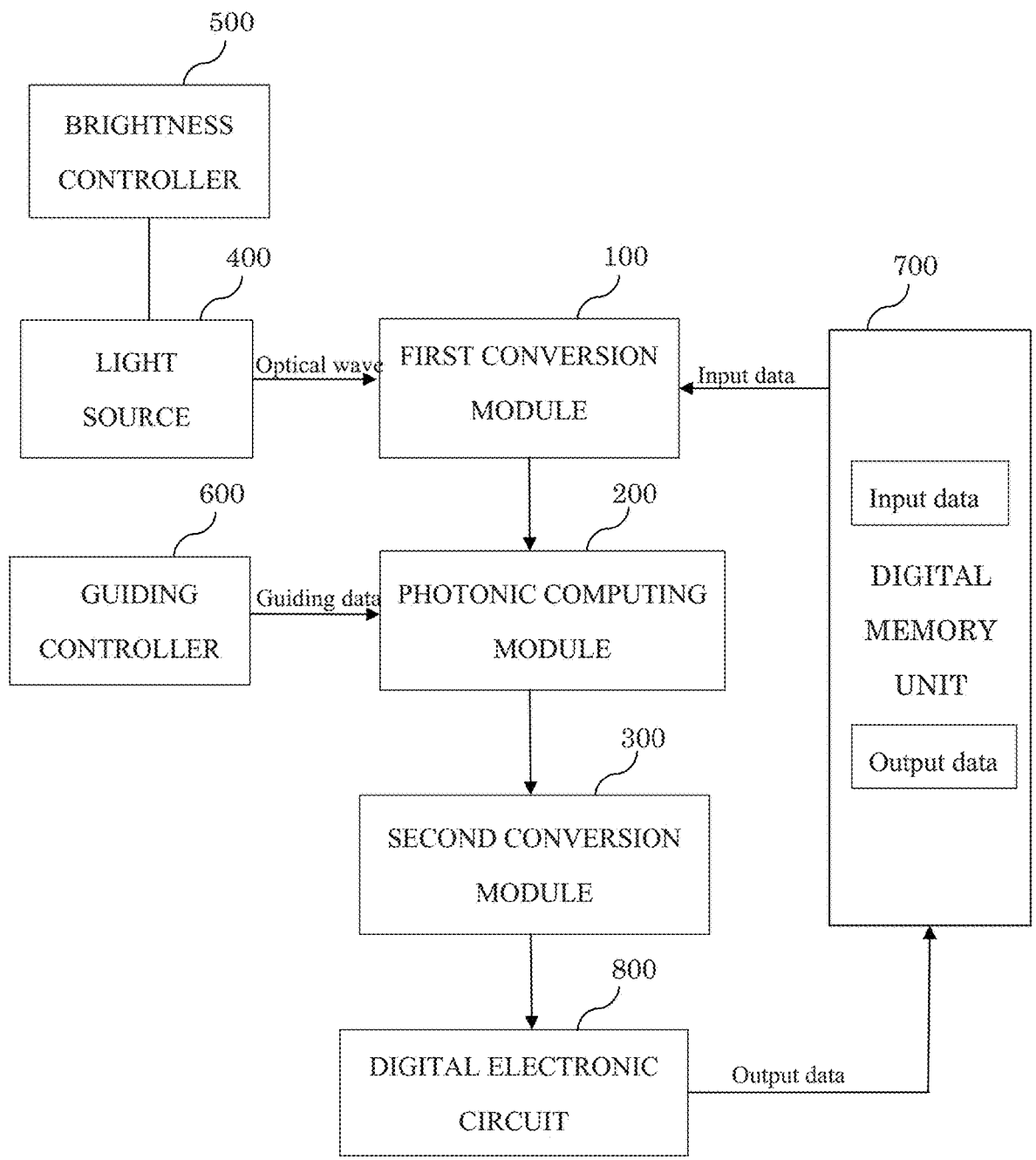
FIG. 5 is a block diagram illustrating a configuration of a system for determining a guided random data sampling according to yet another embodiment of the present invention.

FIG. 5 illustrates a system for determining a guided random data sampling according to yet another embodiment of the present invention. The difference between the embodiment shown in FIG. 5 and the embodiment shown in FIG. 4 is that the system of the former further comprises a digital electronic circuit 800. The digital electronic circuit 800 is in communication with the second conversion module 300 and the digital memory unit 700 and configured to perform additional processing on the output data from the second conversion module 300 and outputting the additionally processed data that is then stored in the digital memory unit 700. In some embodiments, the digital electronic circuit 800 includes one or any combination of FPGAs, ASICs, GPUs, and CPUs. In some embodiments, the additional processing includes one or a combination of adding a digital perturbation to the output data, modifying the output data according to a function, and calculating quantities determined by the output data.

In some embodiments, the processing of the first conversion module 100, the photonic computing module 200, the second conversion module 300, and the digital electronic circuit 800 is performed in a loop. The digital memory unit 700 is operated such that the input data for the current execution of the loop comprises the output data (the additionally processed data) that is output from the previous execution of the loop. The output data of each cycle is stored into the digital memory unit 700 by the digital electronic circuit 800 to form a data sequence. Wherein the data sequence stored in the digital memory unit 700 approximates at least one solution to a problem of one or a combination of signal processing, optimization, data sciences, machine learning, matrix computation, and the like.

In some embodiments, the matrix of weights is used to determine a model of a combinatorial optimization problem; the initial input data comprises an initial approximate solution of the combinatorial optimization problem; and the sequence of data is a sequence of updated approximate solutions to the combinatorial optimization problem. That is, given an initial approximate solution of the combinatorial optimization problem determined by the matrix, an updated approximate solution of the combinatorial optimization problem can be determined by the above-described guided random sampling including the guiding transformation and the random sampling operation. In some embodiments, the combinatorial optimization problem comprises one or more of an Ising problem, a Max-Cut problem, a graph 2-coloring problem, and a Min-Cut problem.

According to embodiments of the present invention, an objective function and the matrix of the combinatorial optimization problem can be determined from matrixes and objective functions of one or a combination of the Ising problem, the Max-Cut problem, the graph 2-coloring problem, and the Min-Cut problem, wherein an approximate or exact solution of the combinatorial optimization problem comprises a vector approximately or exactly minimizing or maximizing the objective function, which corresponds to an approximate or exact solution to the one or the combination of the Ising problem, the Max-Cut problem, the graph 2-coloring problem, and the Min-Cut problem. In some embodiments, the initial approximate solution comprises an input binary vector; the guiding input vector comprises the initial approximate solution binary vector and the sampling input vector comprises the transformed vector; the random sampling operation further comprises comparing the perturbed transformed vector to a threshold vector by a comparator (For example, thresholding the guided optical signal to the digital output signal that is binary consisting of zeros and ones through a analog-to-digital converter combined with a thresholding unit) to yield the updated approximate solution of the combinatorial optimization problem comprising an output binary vector. The randomly sampled vectors are iterated in an iterative loop starting from an initial approximate solution to yield a sequence of approximate solutions to the combinatorial optimization problem.

In some embodiments, the digital electronic circuit 800 also performs a quantitative measure of the quality of the approximate solution to the combinatorial optimization problem by the output data stored as the sequence of data in the digital memory unit. Wherein the determined quantitative measure comprises one or a combination of a quadratic form for the matrix of weights, an energy of a model determined by the matrix of weights, and an objective function or a valuation function of an optimization problem determined by the matrix of weights.

The configuration of the system for determining a guided random data sampling of the present invention has been described above from the perspective of a module structure. The circuit structure of the system for determining a guided random data sampling of the present invention will be described with reference to FIGS. 6 to 8.

Figure 6:
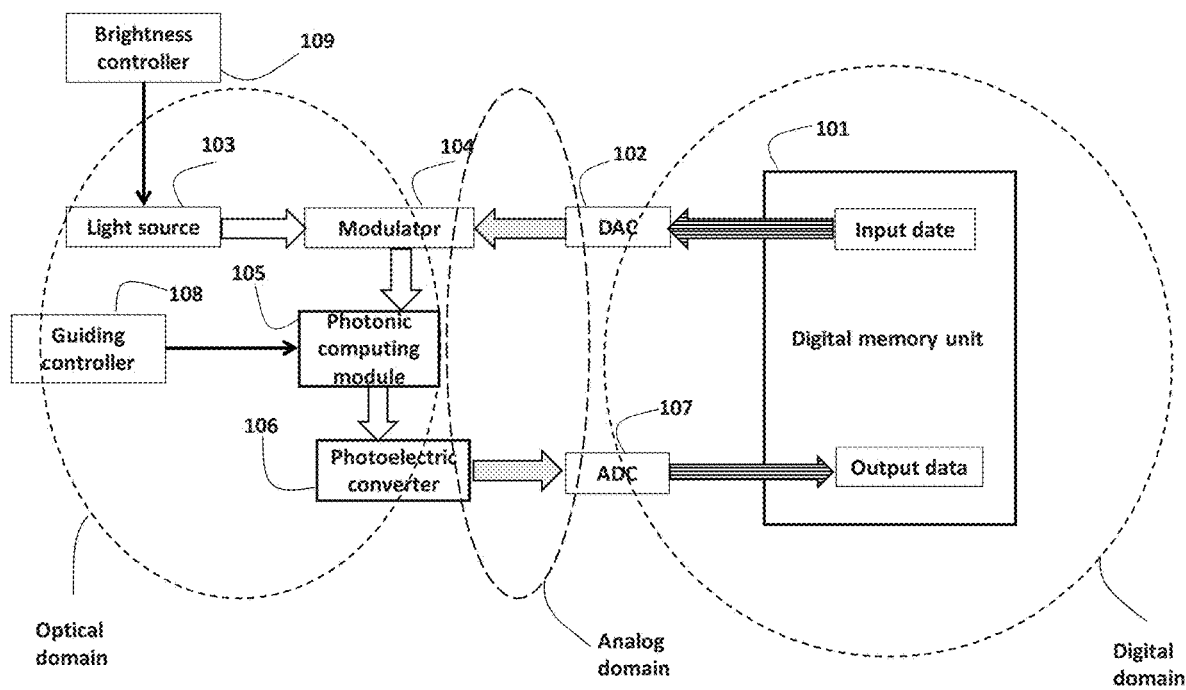
FIG. 6 illustrates an example of a system for determining a guided random data sampling of the present invention.

FIG. 6 illustrates an example of a system for determining a guided random data sampling of the present invention. FIGS. 7a to 7e show changes in the signal waveform output by some devices in the example shown in FIG. 6. As shown in FIG. 6, the system for determining a guided random data sampling of the present invention is a hybrid system involving the optical, analog, and digital domains. The system includes at least a digital memory unit 101, a digital-to-analog converter (DAC) 102, a light source 103, a modulator 104, a photonic computing module 105, a photoelectric converter 106, an analog-to-digital converter (ADC) 107, a guiding controller 108, and a brightness controller 109. In the optical domain, optical signal processing is performed by the light source 103, the modulator 104, the photonic computing module 105, and the photoelectric converter 106, and communication is performed through the optical waveguide. The first conversion module may include the digital-to-analog converter 102 and the modulator 104, and the second conversion module may include the photoelectric converter 106 and the analog-to-digital converter 107. In the analog domain, communication is performed by analog electrical signals. In the digital domain, data is accessed through the digital memory unit 101 and communication is performed by digital electrical signals. Conversion between the digital domain and the analog domain is performed by the digital-to-analog converter 102 and the analog-to-digital converter 107. A connection relationship or a cooperative relationship between the components and the processing performed by each component will be described in detail below.

The digital memory unit 101 has input data stored therein. The digital-to-analog converter 102 is in operational communication with the digital memory unit 101 to convert the input data to an analog input signal. In some embodiments, the system may include a plurality of digital-to-analog converters 102 for converting the input data to a plurality of analog input signals.

The light source 103 is in operational communication with the brightness controller 109 which controls the intensity of the light to generate a plurality of optical waves with variable average intensity. In particular, the brightness controller 109 controls the brightness of the light source 103 such that the average intensity of the plurality of optical waves decreases as the brightness of the light source 103 decreases. In some embodiments, the light source 103 comprises a laser, and the brightness controller 109 is configured to control the intensity of the current transmitted from a power supply to the laser, thereby controlling the brightness of the light source 103 and the average intensity of the optical waves. In some embodiments, the system may include a plurality of light sources 103 and a plurality of brightness controllers 109, corresponding to the plurality of digital-to-analog converters 102, to generate a plurality of optical waves along multiple paths to cooperate with the plurality of digital-to-analog converters 102.

The modulator 104 is in photonic communication with the light source 103 and is in electrical communication with the digital-to-analog converter 102. The modulator 104 modulates the plurality of optical waves according to the analog input signal provided by the digital-to-analog converter 102 to generate a plurality of modulated optical waves (i.e., an optical signal with variable average intensity), and the average intensity of the modulated optical waves varies with the average intensity of the optical waves generated by the light source 103. In some embodiments, the system may include a plurality of modulators 104, corresponding to the plurality of light sources 103 and the plurality of digital-to-analog converters 102, to produce a plurality of modulated optical waves along multiple paths with variable average intensity.

The photonic computing module 105 such as a PIC is in operational communication with the guiding controller 108 and is in photonic communication with the modulator 104. The photonic computing module 105 guides the plurality of modulated optical waves into a plurality of guided optical waves (i.e., a guided optical signal with a variable average intensity) according to the guiding data provided by the guiding controller 108, and the average intensity of the guided optical waves varies with the average intensity of the modulated optical waves. In some embodiments, the guiding data includes a matrix of weights, and the photonic computing module 105 guides the modulated optical waves by further modulating the modulated optical waves according to a guiding transformation determined by the weights of the matrix to obtain the guided optical waves, wherein the guiding transformation may be a corresponding multiplication of the modulated optical waves by the matrix of weights. In some embodiments, the system may include a plurality of photonic computing modules 105 and a plurality of guide controllers 108, corresponding to a plurality of modulators 104, to convert into a plurality of guided optical waves along multiple paths with variable average intensities.

The photoelectric converter 106 such as photodetector comprising photodiode is in photonic communication with the photonic computing module 105 to convert the guided optical waves into an analog output signal having average amplitude that varies with the average intensity of the guided optical waves. In some embodiments, the system may include a plurality of photoelectric converters 106, corresponding to the plurality of photonic computing modules 105, to convert the plurality of guided optical waves along multiple paths with variable average intensities into a plurality of analog output signals with variable average amplitudes.

The analog-to-digital converter 107 is in electrical communication with the photoelectric converter 106 to convert the analog output signal with variable average amplitude into a digital output signal as output data. The analog-to-digital converter 107 is also in electrical communication with the digital memory unit 101 to store the output data into the digital memory unit 101. In some embodiments, the analog-to-digital converter 107 is provided with thresholding to yield binary output, for example, the analog-to-digital converter is combined with a thresholding unit to threshold the analog output signal into the digital output signal which is a binary signal consisting of zeros and ones. In some embodiments, corresponding to the plurality of photoelectric converters 106, the system may include a plurality of analog-to-digital converters 107 to convert the plurality of analog output signals with variable average amplitudes into a plurality of digital output signals as the output data.

At least one of the optical units such as the modulator 104, the photonic computation module 105, and the photoelectric converter 106 is noisy, and/or at least one of the analog devices such as the digital-to-analog converter 102 and the analog-to-digital converter 107 is noisy, thus the optical unit and/or the analog device having noise introduce a perturbation into at least one of the optical waves (comprising the modulated optical waves, the guided optical waves) and the analog signals (comprising the analog output signal, the analog input signal). And a ratio of the noise and at least one of the average intensities of the optical waves and the average amplitudes of the analog signals decreases as the brightness of the light source 103 decreases, thereby adding a perturbation to the digital output data, wherein the level of the perturbation increases with the decrease of the ratio, wherein the level of perturbation increases as the ratio decreases, thereby increasing the randomness of the guided data sampling.

Figure 7A:
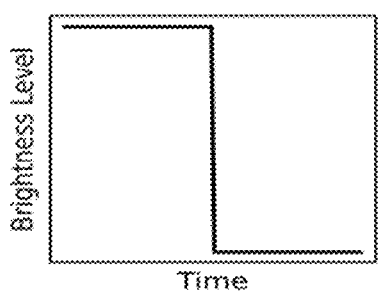
Figure 7B:
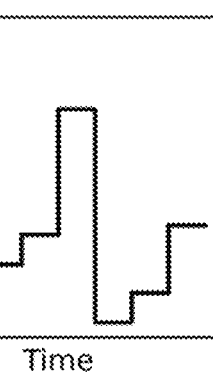
Figure 7C:
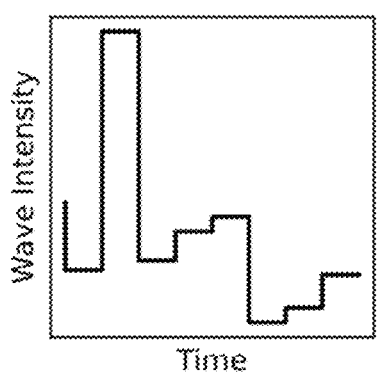
Figure 7D:
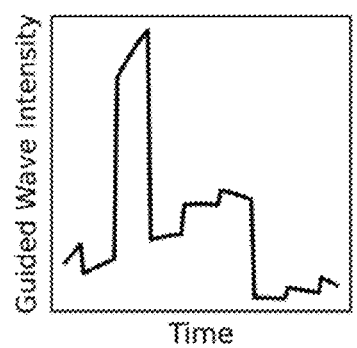
Figure 7E:
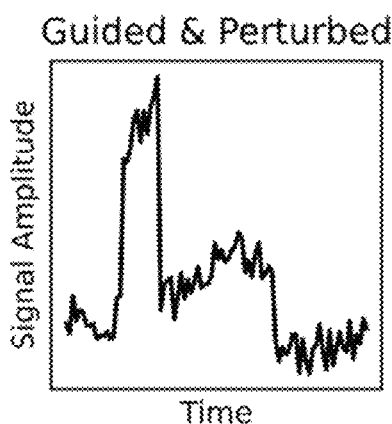

In particular, FIGS. 7a to 7e show how the decrease of brightness of the light source 103 subsequently affects all the optical waves and the analog signal in the workflow. The brightness curve of FIG. 7a shows the brightness variation of the light source and the signal waveform of FIG. 7b shows the signal amplitude variation of the analog input signal before it is input to the modulator 104, wherein the analog input signal coming out of the digital-to-analog converter 102 has the amplitude in time with two distinctive peaks. According to the brightness curve and the signal waveform, the first one of these peaks appears at the time of the large value of the brightness of the light source, while the second one of these peaks appears at the time of the small value of the brightness of the light source, which results in the modulated optical waves produced by the modulator 104 having an optical wave intensity as shown in the wave intensity curve of FIG. 7c. The wave intensity curve of FIG. 7c shows the first peak of the wave intensity of the modulated optical waves is clearly visible, but the second peak is relatively smaller, consistently with the level of the brightness of the light source 103. As the modulated optical waves with variable average intensity turn into the guided optical waves with variable average intensity according to the guiding data operationally provided by the guiding controller 108, the intensity of the guided optical waves has a modified shape as shown in FIG. 7d. The guided wave intensity curve of FIG. 7c shows the first peak of the guided wave intensity is visibly more pronounced compared to the second peak of the guided wave intensity. It is assumed that the system has a plurality of photoelectric converters 106 that is noisy and converts a plurality of guided optical waves with variable average intensity into a plurality of analog output signals with variable average amplitude, the plurality of analog output signals can be uniformly added with white noise in time. As shown by the signal waveform in FIG. 7e, the amplitude of the analog output signal is perturbed by the noise. While the first peak in the amplitude of the analog output signal is still well pronounced despite of the perturbation due to the noise, the second peak is barely visible on the noisy background, implying that the output data produced by analog-to-digital converter 107 will be more random at the time when the level of the brightness of the light source 103 is smaller. Therefore, FIGS. 7a to 7e show how the decrease of brightness of the light source 103 increases the randomness of the guided data sampling. In the problem-solving operation, the output data can be used as the input data for loop operation, and the series of output data will be more convergent through the loop operation.

Figure 8:
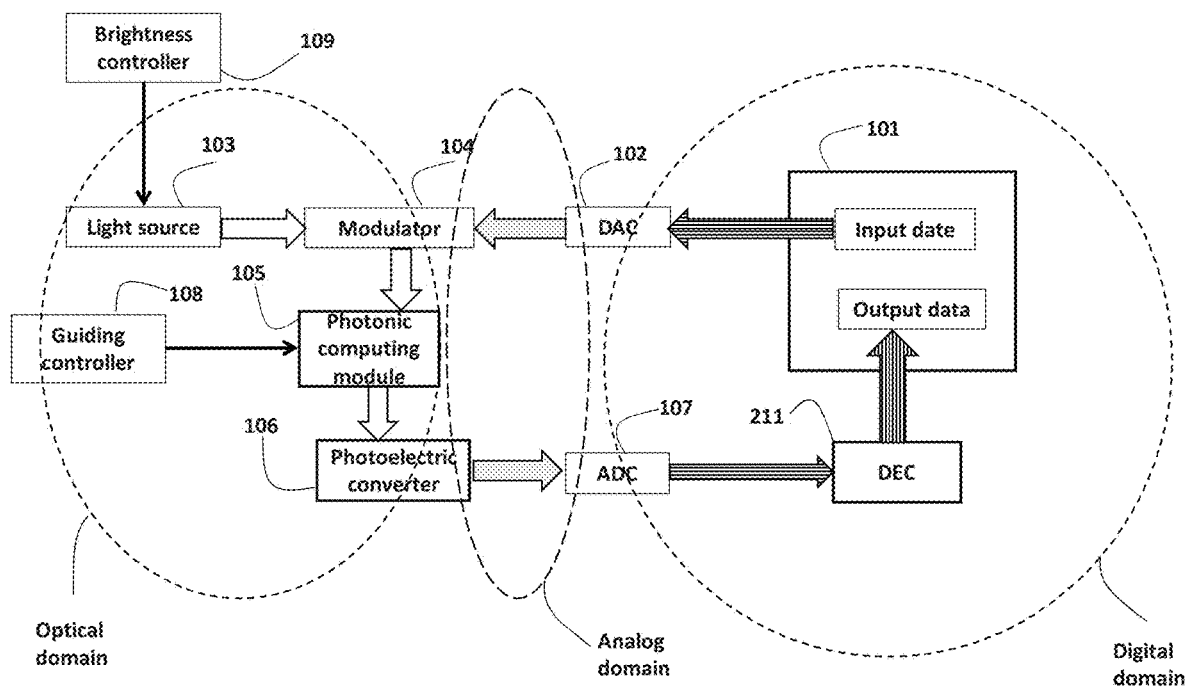
FIG. 8 illustrates another example of a system for determining a guided random data sampling of the present invention.

FIG. 8 illustrates another example of a system for determining a guided random data sampling of the present invention. Compared with the example shown in FIG. 6, the system in the example shown in FIG. 8 further includes a digital electronic circuit (DEC) 211 that is in operational communication with the analog-to-digital converter 107 and in operational communication with the digital memory unit 101. The digital electronic circuit 211 is configured to perform additional processing on the output data of the analog-to-digital converter 107 before it is stored in the digital memory unit 101. As shown in FIG. 8, the digital electronic circuit 211 performs additional processing on the digital data output from the analog-to-digital converter 107 to produce output data. In some embodiments, the additional processing may include one or any combination of adding a digital perturbation to the output data, modifying the output data according to a function, and calculating quantities determined by the output data for storing in a digital memory unit together with the original, perturbed, or modified output data. In some embodiments, the digital electronic circuit includes one or a combination of a field programmable gate array (FPGA), an application specific integrated circuit (ASIC), a graphics processing unit (GPU), and a computer processing unit (CPU).

In some embodiments, the system performs the processing in a loop. Specifically, the digital memory unit 101 is operated so that the output data from the previous execution of the loop constitutes the input data for the current execution of the loop, and the output data of each loop execution is stored in the digital memory unit 101 by the digital electronic circuit 211 to form a sequence of data. Wherein the sequence of data stored in the digital memory unit 101 approximates at least one of solutions of a problem of one or a combination of signal processing, optimization, data sciences, machine learning, matrix computing, and the like.

In some embodiments, a model of a combinatorial optimization problem can be determined using the matrix of weights; the initial input data comprises an initial approximate solution of the combinatorial optimization problem; and the sequence of data is a sequence of updated approximate solutions of the combinatorial optimization problem. That is, given an initial approximate solution of the combinatorial optimization problem determined by the matrix, an updated approximate solution of the combinatorial optimization problem can be determined by the above-described guided random sampling including the guiding transformation and the random sampling operation. Optionally, the combinatorial optimization problem includes one or more of an Ising problem, a Max-Cut problem, a graph 2-coloring problem, and a Min-Cut problem. An objective function and the matrix of the combinatorial optimization problem can be determined from matrixes and objective functions of one or a combination of the Ising problem, the Max-Cut problem, the graph 2-coloring problem, and the Min-Cut problem, wherein an approximate or exact solution of the combinatorial optimization problem comprises a vector approximately or exactly minimizing or maximizing the objective function, which corresponds to an approximate or exact solution to the one or the combination of the Ising problem, the Max-Cut problem, the graph 2-coloring problem, and the Min-Cut problem. In some embodiments, the initial approximate solution comprises an input binary vector; the guiding input vector comprises the initial approximate solution binary vector and the sampling input vector comprises the transformed vector; the random sampling operation further comprises comparing the perturbed transformed vector to a threshold vector by a comparator (For example, a analog-to-digital converter combined with a thresholding unit can be used for thresholding the guided optical signal to the digital output signal that is binary consisting of zeros and ones) to yield the updated approximate solution of the combinatorial optimization problem, wherein the updated approximate solution comprises an output binary vector. The randomly sampled vectors are iterated in an iterative loop starting from an initial approximate solution to yield a sequence of approximate solutions to the combinatorial optimization problem.

In some embodiments, the digital electronic circuit 211 also performs a quantitative measure of the quality of the approximate solution to the combinatorial optimization problem by the output data stored as the sequence of data in the digital memory unit 101. The determined quantitative measure comprises one or a combination of a quadratic form for the matrix of weights, an energy of a model determined by the matrix of weights, and an objective function or a valuation function of an optimization problem determined by the matrix of weights.

According to various embodiments of the present invention, a random data sampling can be performed in the optical-electric hybrid domain, such that an updated approximate solution can be converged to a desired solution in an iterative process of problem solving with a light source of variable brightness and the addition of multiple perturbations to the optical wave and/or analog signal. Embodiments of the present invention can greatly increase the processing speed compared to processing in a pure electric domain.

A person of ordinary skill in the art should understand that the various embodiments and examples disclosed herein are described for purpose of illustration only. It is not intended to be exhaustive or to limit the invention. Many modifications and variations are possible in light of the above teaching and the scope of the appended claims should be construed as broadly as the prior art will permit.

What we claimed is:

1. A method for determining a guided random data sampling, comprising the following steps:

S1, converting input data into an optical signal through a first conversion module, wherein an average intensity of the optical signal varies with a brightness of a light source, and converting the input data into the optical signal comprises converting an input signal into an analog signal and modulating an optical wave according to the analog signal;

S2, converting the optical signal into a guided optical signal according to guiding data by a photonic computing module, wherein the average intensity of the guided optical signal varies with the average intensity of the optical signal; and S3, converting the guided optical signal into output data and outputting the output data by a second conversion module;

wherein a noise generated by at least one of the first conversion module, the photonic computing module, and the second conversion module is added to the output data as a perturbation, and a ratio of the noise and at least one of an average intensity of the optical wave or an average amplitude of the analog signal decreases as the brightness of the light source decreases, thereby adding the perturbation to the output data.

2. The method of claim 1, wherein the average intensity of the optical wave is variable such that the average intensity of the optical signal varies with the average intensity of the optical wave.

3. The method of claim 2, wherein the optical wave is generated by the light source, the brightness of the light source is controlled by a brightness controller, and decreasing the brightness of the light source decreases the average intensity of the optical wave.

4. The method of claim 1, wherein the guiding data comprises a matrix of weights,
   at step S2, converting the optical signal into the guided optical signal according to guiding data comprises:
   modulating the optical signal according to a guiding transformation determined by the weights of the matrix to obtain the guided optical signal in the photonic computing module.

5. The method of claim 4, wherein the optical signal comprises a plurality of modulated optical waves,
   the guiding transformation determined by the weights of the matrix comprises multiplying the plurality of modulated optical waves by the matrix of weights in the photonic computing module.

6. The method of claim 4, wherein the guiding data is provided to the photonic computing module by a guiding controller.

7. The method of claim 1, wherein the second conversion module comprises a photoelectric converter and an analog-to-digital converter;
   at step S3, converting the guided optical signal into output data and outputting the output data comprises:
   converting the guided optical signal into an analog output signal by the photoelectric converter, and
   converting the analog output signal into a digital output signal as the output data by the analog-to-digital converter.

8. The method of claim 4, further comprising:
S4, performing additional processing on the output data and outputting the additionally processed data by a digital electronic circuit.

9. The method of claim 8, wherein the additional processing comprises one or a combination of:
   adding a digital perturbation to the output data;
   modifying the output data according to a function, and
   calculating quantities determined by the output data for storing in a digital memory unit together with the original, perturbed, or modified output data.

10. The method of claim 8, further comprising:
    performing steps S1 to S4 in a loop, wherein the input data for the current execution of the loop comprises the additionally processed data output from the previous execution of the loop, and wherein the loop is executed a pre-determined number of cycles;
    storing the output data of all cycles in a digital memory unit to form a sequence of data.

11. The method of claim 10, wherein the matrix of weights is used to determine a model of a combinatorial optimization problem;
    the initial input data comprises an approximate solution of the combinatorial optimization problem;
    the sequence of data is a sequence of updated approximate solutions to the combinatorial optimization problem.

12. The method of claim 11, further comprising quantitatively measuring the quality of the approximate solution of the combinatorial optimization problem processed by the steps S1-S3, by the digital electronic circuit, through the output data stored as the sequence of data in the digital memory unit.

13. The method of claim 11, wherein the combinatorial optimization problem comprises one or more of an Ising problem, a Max-Cut problem, a graph 2-coloring problem, and a Min-Cut problem.

14. The method of claim 8, wherein the digital electronic circuit comprises one or a combination of a field programmable gate array (FPGA), an application specific integrated circuit (ASIC), a graphics processing unit (GPU), and a computer processing unit (CPU).

15. A system for determining a guided random data sampling, comprising:
    a first conversion module for converting input data into an optical signal, wherein an average intensity of the optical signal varies with a brightness of a light source;
    a digital-to-analog converter for converting the input data into an analog input signal; and
    a modulator, in communication with the digital-to-analog converter, for modulating an optical wave according to the analog input signal to obtain the optical signal;
    a photonic computing module, in communication with the first conversion module, for converting the optical signal into a guided optical signal according to guiding data, wherein the average intensity of the guided optical signal varies with the average intensity of the optical signal; and
    a second conversion module, in communication with the photonic computing module, for converting the guided optical signal into output data and outputting the output data;
    wherein a noise generated by at least one of the first conversion module, the photonic computing module, and the second conversion module is added to the output data as a perturbation, and
    a ratio of the noise and at least one of an average intensity of the optical wave or an average amplitude of the analog signal decreases as the brightness of the light source decreases, thereby adding the perturbation to the output data.

16. The system of claim 15, wherein the average intensity of the optical wave is variable such that the average intensity of the optical signal varies with the average intensity of the optical wave.

17. The system of claim 16, wherein the optical wave is generated by the light source and the system further comprises:
- a brightness controller for controlling the brightness of the light source such that decreasing the brightness of the light source decreases the average intensity of the optical wave.

18. The system of claim 15, further comprising a guiding controller for providing the guiding data to the photonic computing module, the guiding data comprising a matrix of weights;
- wherein the photonic computing module is configured to further modulate the optical signal according to a guiding transformation determined by the weights of the matrix to guide the optical signal, so as to obtain the guided optical signal.

19. The system of claim 18, wherein the optical signal comprises a plurality of modulated optical waves,
- the guiding transformation determined by the weights of the matrix comprises multiplying the plurality of modulated optical waves by the matrix of weights in the photonic computing module.

20. The system of claim 15, wherein the second conversion module comprises:
- a photoelectric converter, in communication with the photonic computing module, for converting the guided optical signal into an analog output signal, and
- an analog-to-digital converter, in communication with the photoelectric converter, for converting the analog output signal into a digital output signal as the output data.

21. The system of claim 15, further comprising a digital electronic circuit, in communication with the second conversion module, for performing additional processing on the output data and outputting the additionally processed data.

22. The system of claim 21, wherein the additional processing comprises one or a combination of:
- adding a digital perturbation to the output data;
- modifying the output data according to a function; and
- calculating quantities determined by the output data for storing in a digital memory unit together with the original, perturbed, or modified output data.

23. The system of claim 21, further comprising a digital memory unit, in communication with the digital electronic circuit and the first conversion module, for storing the input data and the additionally processed data;
- wherein the processing of the first conversion module, the photonic computing module, the second conversion module and the digital electronic circuit is performed in a loop, the digital memory unit is operated such that the input data for the current execution of the loop comprises the additionally processed data output from the previous execution of the loop, the loop is executed a pre-determined number of cycles; and
- wherein the output data of all cycle is stored by the digital electronic circuit into the digital memory unit to form a sequence of data.

24. The system of claim 23, wherein the matrix of weights is used to determine a model of a combinatorial optimization problem;
- wherein the initial input data comprises an approximate solution of the combinatorial optimization problem; and
- wherein the sequence of data is a sequence of updated approximate solutions to the combinatorial optimization problem.

25. The system of claim 24, wherein the digital electronic circuit is configured to further perform a quantitative measure of the quality of the approximate solution to the combinatorial optimization problem by the output data stored as the sequence of data in the digital memory unit.

26. The system of claim 24, wherein the combinatorial optimization problem comprises one or more of an Ising problem, a Max-Cut problem, a graph 2-coloring problem, and a Min-Cut problem.

27. The system of claim 21, wherein the digital electronic circuit comprises one or a combination of a field programmable gate array (FPGA), an application specific integrated circuit (ASIC), a graphics processing unit (GPU), and a computer processing unit (CPU).

* * * * *